(12) United States Patent
Ye

(10) Patent No.: US 10,782,837 B2
(45) Date of Patent: Sep. 22, 2020

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Jian Ye, Hubei (CN)

(73) Assignee: Wuhan China Star Optoelectronics Semiconductor Display Technology Co., Ltd., Wuhan, Hubei (CN)

(*) Notice: Subject to any disclaimer, the term of this patent is extended or adjusted under 35 U.S.C. 154(b) by 0 days.

(21) Appl. No.: 16/311,006

(22) PCT Filed: Nov. 7, 2018

(86) PCT No.: PCT/CN2018/114242
§ 371 (c)(1),
(2) Date: Dec. 18, 2018

(87) PCT Pub. No.: WO2020/062454
PCT Pub. Date: Apr. 2, 2020

(65) Prior Publication Data
US 2020/0097126 A1    Mar. 26, 2020

(51) Int. Cl.
*G06F 3/044* (2006.01)
*H01L 27/32* (2006.01)
*G06F 3/041* (2006.01)

(52) U.S. Cl.
CPC .......... *G06F 3/0443* (2019.05); *G06F 3/0412* (2013.01); *H01L 27/3248* (2013.01)

(58) Field of Classification Search
CPC .... G06F 3/0443; G06F 3/0444; G06F 3/0445; G06F 3/0446; G06F 3/0447; G06F 3/0448; G06F 3/0412; G06F 3/0416; G06F 2203/04103; H01L 27/3248
See application file for complete search history.

(56) References Cited

U.S. PATENT DOCUMENTS

| | | | |
|---|---|---|---|
| 2011/0181548 A1* | 7/2011 | Sekiguchi | G06F 3/044 345/174 |
| 2012/0098788 A1* | 4/2012 | Sekiguchi | G06F 3/044 345/174 |
| 2014/0340337 A1* | 11/2014 | Han | G06F 3/04883 345/173 |

(Continued)

FOREIGN PATENT DOCUMENTS

| | | |
|---|---|---|
| CN | 205038626 U | 2/2016 |
| CN | 107482128 A | 12/2017 |
| CN | 107728835 A | 2/2018 |

*Primary Examiner* — Tom V Sheng
(74) *Attorney, Agent, or Firm* — Muncy, Geissler, Olds & Lowe, P.C.

(57) ABSTRACT

A display panel and a display device are provided. The display panel includes a metal layer, a substrate, a separation layer and a cathode layer, wherein the substrate is disposed on the metal layer; the separation layer is disposed on the substrate, and both the separation layer and the substrate are used for insulating the metal layer and the cathode layer from each other; the cathode layer is disposed on the separation layer, and a capacitance is formed between the cathode and the metal layer; and, when the display panel is pressed, the capacitance between the cathode and the metal layer changes.

18 Claims, 4 Drawing Sheets

(56) References Cited

U.S. PATENT DOCUMENTS

| | | | |
|---|---|---|---|
| 2016/0026315 A1* | 1/2016 | Choi | G06F 3/0414 |
| | | | 345/174 |
| 2016/0320902 A1* | 11/2016 | Chang | G06F 3/0414 |
| 2017/0075493 A1* | 3/2017 | Lee | G06F 3/0418 |
| 2017/0221971 A1* | 8/2017 | Shen | G06F 3/0412 |
| 2017/0351358 A1* | 12/2017 | Matsumoto | H01L 27/3248 |
| 2018/0088708 A1* | 3/2018 | Naganuma | G06F 3/0412 |
| 2018/0260047 A1* | 9/2018 | Wang | G06F 3/0416 |
| 2019/0035858 A1 | 1/2019 | Li et al. | |
| 2019/0187844 A1* | 6/2019 | Ye | H01L 27/3244 |
| 2019/0187848 A1* | 6/2019 | Ma | G06F 3/0446 |
| 2019/0339807 A1 | 11/2019 | Lin et al. | |

* cited by examiner

DISPLAY PANEL AND DISPLAY DEVICE

FIELD OF THE INVENTION

The present application relates to the technical field of display, and in particular to a display panel and a display device.

DESCRIPTION OF THE RELATED ART

The touch technology is a main input form of the human-machine interaction. The touch technology mainly includes a two-dimensional touch technology and a three-dimensional touch technology. In the two-dimensional touch technology, multi-point touch recognition is mainly performed in a two-dimensional plane consisting of the X-axis and Y-axis; while in the three-dimensional touch technology, touch recognition in the Z-axis direction is additionally provided based on the two-dimensional touch technology.

By the three-dimensional touch technology, a user may perform different operations on a terminal by adjusting a force applied to the terminal. For example, when playing a game in a mobile phone, the speed, the leap degree and the like may be controlled according to the force applied to the mobile phone.

In the existing methods for detecting a pressure value, a special pressure sensor is used for detection. The pressure detection is relatively complicated.

SUMMARY OF THE TECHNICAL SOLUTION

An objective of the present invention is to provide a display panel and a display device, which can reduce the complexity of pressure detection.

An embodiment of the present disclosure provides a display panel, comprising a metal layer, a substrate, a separation layer and a cathode layer; wherein the substrate is disposed on the metal layer;

the separation layer is disposed on the substrate, and both the separation layer and the substrate are used for insulating the metal layer and the cathode layer from each other; and the cathode layer is disposed on the separation layer, and a capacitance is formed between the cathode layer and the metal layer; and, when the display panel is pressed, the capacitance between the cathode layer and the metal layer changes; wherein there is a clearance between the substrate and the metal layer;

the display panel further comprises an elastic layer which is disposed between the substrate and the metal layer.

In some embodiments, the display panel further includes a control unit which is electrically connected to the metal layer and the cathode layer;

the control unit is configured to detect a first capacitance between the cathode layer and the metal layer when the display panel is not pressed;

the control unit is configured to detect a second capacitance between the cathode layer and the metal layer when the display panel is pressed; and the control module is configured to generate a force applied to the display panel according to the first capacitance and the second capacitance.

Another embodiment of the present disclosure provides a display panel, comprising a metal layer, a substrate, a separation layer and a cathode layer; wherein the substrate is disposed on the metal layer;

the separation layer is disposed on the substrate, and both the separation layer and the substrate are used for insulating the metal layer and the cathode layer from each other; and the cathode layer is disposed on the separation layer, and a capacitance is formed between the cathode layer and the metal layer; and, when the display panel is pressed, the capacitance between the cathode layer and the metal layer changes.

In some embodiments, the display panel further includes a control unit which is electrically connected to the metal layer and the cathode layer;

the control unit is configured to detect a first capacitance between the cathode layer and the metal layer when the display panel is not pressed;

the control unit is configured to detect a second capacitance between the cathode layer and the metal layer when the display panel is pressed; and the control module is configured to generate a force applied to the display panel according to the first capacitance and the second capacitance.

In some embodiments, the cathode layer comprises a plurality of touch units which are electrically connected to the control unit;

the plurality of touch units are electrically independent of each other; and the control unit is configured to determine, according to the change in capacitance between the plurality of touch units and a pressing finger, a pressed position on the display panel.

In some embodiments, there is a clearance between the substrate and the metal layer.

In some embodiments, the display panel further includes an elastic layer which is disposed between the substrate and the metal layer.

In some embodiments, the metal layer is grounded.

In some embodiments, the separation layer comprises an anode layer, a light-emitting layer and a pixel definition layer;

the anode layer is disposed on the substrate;

the light-emitting layer is disposed on the anode layer; and the pixel definition layer is disposed on the anode layer and the light-emitting layer.

In some embodiments, the display panel further includes a thin film transistor layer and a planarization layer;

the thin film transistor layer is disposed on the substrate;

the planarization layer is disposed on the thin film transistor layer; and the separation layer is disposed on the planarization layer.

In some embodiments, the display panel further includes an encapsulation layer, a polarizer and a cover plate;

the encapsulation layer is disposed on the cathode layer;

the polarizer is disposed on the encapsulation layer; and the cover plate is disposed on the polarizer.

An embodiment of the present disclosure further provides a display device, comprising a display panel, wherein the display panel includes:

a metal layer, a substrate, a separation layer and a cathode layer; wherein the substrate is disposed on the metal layer;

the separation layer is disposed on the substrate, and both the separation layer and the substrate are used for insulating the metal layer and the cathode layer from each other; and the cathode layer is disposed on the separation layer, and a capacitance is formed between the cathode layer and the metal layer; and, when the display panel is pressed, the capacitance between the cathode layer and the metal layer changes.

In some embodiments, the display panel further includes a control unit which is electrically connected to the metal layer and the cathode layer;

the control unit is configured to detect a first capacitance between the cathode layer and the metal layer when the display panel is not pressed;

the control unit is configured to detect a second capacitance between the cathode layer and the metal layer when the display panel is pressed; and the control module is configured to generate a force applied to the display panel according to the first capacitance and the second capacitance.

In some embodiments, the cathode layer comprises a plurality of touch units which are electrically connected to the control unit;

the plurality of touch units are electrically independent of each other; and the control unit is configured to determine, according to the change in capacitance between the plurality of touch units and a pressing finger, a pressed position on the display panel.

In some embodiments, there is a clearance between the substrate and the metal layer.

In some embodiments, the display panel further includes an elastic layer which is disposed between the substrate and the metal layer.

In some embodiments, the metal layer is grounded.

In some embodiments, the separation layer comprises an anode layer, a light-emitting layer and a pixel definition layer;

the anode layer is disposed on the substrate;

the light-emitting layer is disposed on the anode layer; and the pixel definition layer is disposed on the anode layer and the light-emitting layer.

In some embodiments, the display panel further includes a thin film transistor layer and a planarization layer;

the thin film transistor layer is disposed on the substrate;

the planarization layer is disposed on the thin film transistor layer; and the separation layer is disposed on the planarization layer.

In some embodiments, the display panel further includes an encapsulation layer, a polarizer and a cover plate;

the encapsulation layer is disposed on the cathode layer;

the polarizer is disposed on the encapsulation layer; and the cover plate is disposed on the polarizer.

In the display panel and the display device provided in the embodiments of the present invention, by providing a metal layer capable of forming a capacitance with the cathode layer, the pressure detection is realized by detecting the change in capacitance between the cathode layer and the metal layer, so that the complexity of the pressure detection is reduced.

BRIEF DESCRIPTION OF THE DRAWINGS

In order to make the contents of the present invention more easily understood, the preferred embodiments of the present invention are described in detail, in cooperation with accompanying drawings, as follows.

DETAILED DESCRIPTION OF THE PREFERRED EMBODIMENTS

Figure 1:
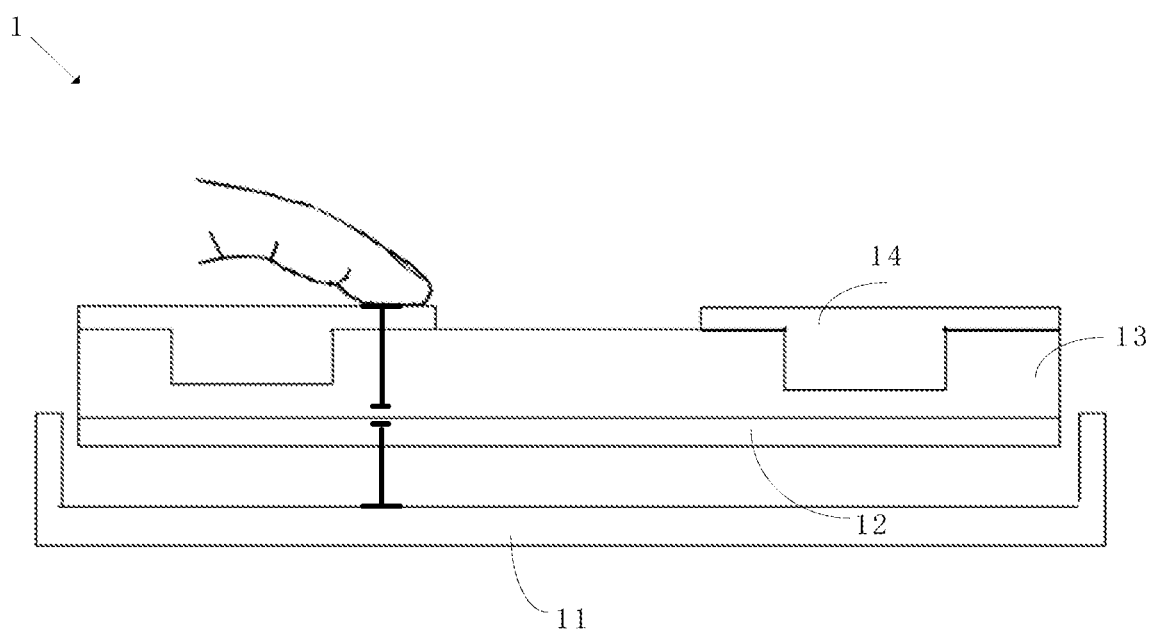
FIG. 1 is a schematic structure diagram of a display panel according to an embodiment of the present invention.

The following description of the embodiments is used for illustrating particular embodiments to be implemented in the present invention. The directional terms as used here, such as "upper", "lower", "front", "rear", "left", "right", "inner", "outer" and "side", merely refer to the directions shown in the accompanying drawings. Therefore, the used directional terms are used for describing and understanding the present invention, rather than limiting the present invention.

In the accompanying drawings, the units of similar structures are denoted by similar reference numerals.

The term "embodiment" referred to herein means that a particular feature, structure, or feature described in connection with the implementation may be contained in at least one implementation of the present disclosure. The phrase appearing in various places in the specification does not necessarily refer to the same implementation, nor does it refer to an independent or alternative implementation that is mutually exclusive with other implementations. It is expressly and implicitly understood by the person skilled in the art that an implementation described herein may be combined with other implementations.

An embodiment of the present invention provides a display device, including a display panel. Referring to FIG. 1, FIG. 1 is a schematic structure diagram of the display panel according to an embodiment of the present invention. The display panel 1 includes a metal layer 11, a substrate 12, a separation layer 13 and a cathode layer 14.

The metal layer 11 is made of metal material and is electrically conductive. In some embodiments, the metal layer 11 is grounded and has zero potential, and may provide a reference voltage. Specifically, for example, for display devices such as mobile phones, the metal layer 11 may be a middle frame made of metal material, wherein the middle frame is a frame for supporting the display devices such as mobile phones.

The substrate 12 is disposed on the metal layer 11. The substrate 12 is used for bearing other structures provided thereon. The substrate 12 may be made of flexible material or rigid material which is insulating. Specifically, the substrate 12 may be made of polyimide.

Figure 2:
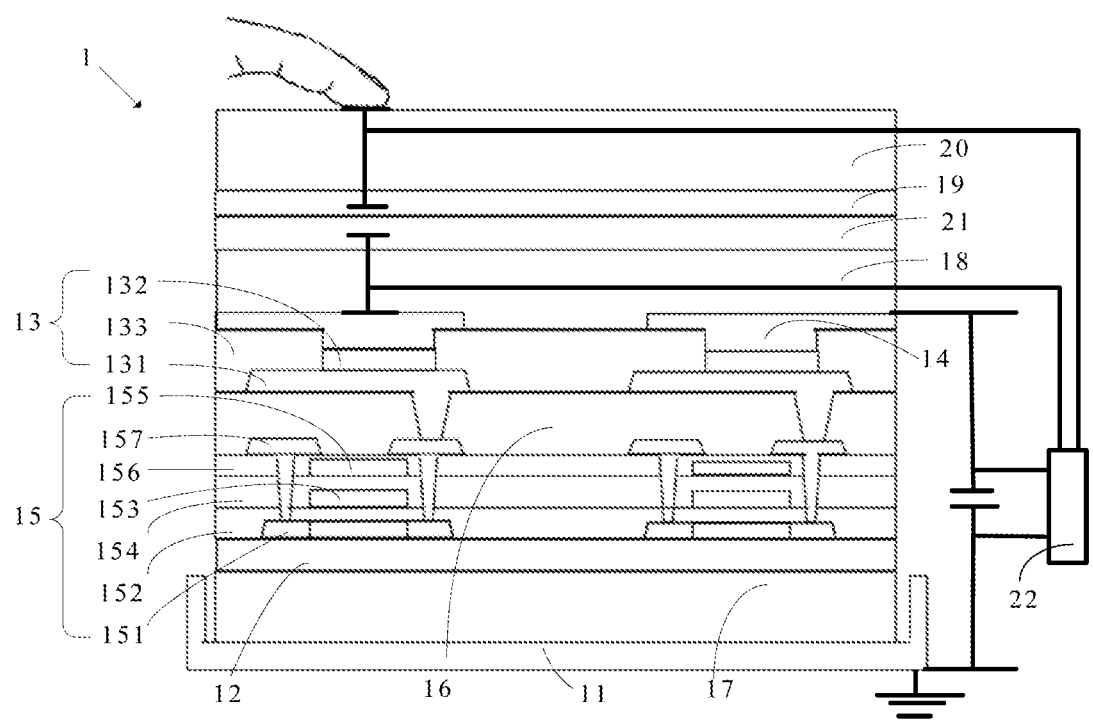
FIG. 2 is another schematic structure diagram of the display panel according to an embodiment of the present invention.

The separation layer 13 is disposed on the substrate 12. The separation layer 13 is used for separating the metal layer 11 from the cathode layer 14 so that the metal layer 11 is insulated from the cathode layer 14. As shown in FIG. 2, the separation layer 13 includes an anode layer 131, a light-emitting layer 132 and a pixel definition layer 133. The anode layer 131 is disposed on the substrate 12. The anode layer 131 may be made of metal oxide. In some embodiments, the anode layer 131 is made of opaque metal, for example, aluminum. The light-emitting layer 132 is disposed on the anode layer 131. The light-emitting layer 132 is made of light-emitting material and used for emitting light. The pixel definition layer 133 is disposed on the anode layer 131 and the light-emitting layer 132. The pixel definition layer 133 may be made of photoresist material.

In some embodiments, the display panel 1 further includes a thin film transistor layer 15 and a planarization layer 16. The thin film transistor layer 15 is disposed on the substrate 12. Specifically, the thin film transistor layer 15 includes a doped layer 151, a first insulating layer 152, a first metal layer 153, a second insulating layer 154, a second metal layer 155, an interlayer insulating layer 156 and a source/drain layer 157.

The doped layer 151 is disposed on the substrate 12. The doped layer 151 includes a first doped region, a second doped region and an active layer disposed between the first doped region and the second doped region. The active layer may be made of amorphous silicon material. The first insulating layer 152 is disposed on the doped layer.

The first insulating layer 152 may include a plurality of layers of non-metallic films, for example, a silicon dioxide/ silicon nitride (SiO2/SiNx) stacked layer. The first insulating layer 152 is used for isolating the doped layer 151 from the first metal layer 153.

The first metal layer 153 is disposed on the first insulating layer 152, and scanning lines are provided on the first metal layer 153.

The second insulating layer 154 is disposed on the first metal layer 153. The second insulating layer 154 may include a plurality of layers of non-metallic films, for example, a SiO2/SiNx stacked layer. The second insulating layer 154 is used for isolating the first metal layer 153 from the second metal layer 155.

The second metal layer 155 is disposed on the second insulating layer 154. The interlayer insulating layer 156 is disposed on the second metal layer 155 and used for isolating the second metal layer 155 from the source/drain layer 157.

The source/drain layer 157 is disposed on the interlayer insulating layer 156, and a source/drain wiring is provided on the source/drain layer 157.

The planarization layer 16 is disposed on the thin film transistor layer 15, and the separation layer 13 is disposed on the planarization layer 16. Specifically, the planarization layer 16 is disposed on the source/drain layer and used for planarizing the surface.

The cathode layer 14 is disposed on the separation layer 13, and a capacitance is formed between the cathode layer 14 and the metal layer 11. The cathode layer may be made of one or more of magnesium, aluminum, calcium and other metals. Since the cathode layer 14 and the metal layer 11 are conductors which are electrically conductive and the substrate and the separation layer disposed between the cathode layer and the metal layer are insulating, a capacitance will be formed when the cathode layer and the metal layer get close to each other. When the display panel 1 is pressed, the distance between the cathode layer 14 and the metal layer 11 changes, and the capacitance between the both also changes. Thus, the force applied to the display panel 1 may be detected by the change in the capacitance between the both.

In some embodiments, the display panel 1 further includes a control unit 22. The control unit 22 may acquire capacitance information and then analyze the capacitance information. Specifically, the control unit 22 may be a driving chip. The control unit 22 is electrically connected to the metal layer 11 and the cathode layer 13 and may be used for detecting the change in the capacitance between the metal layer 11 and the cathode layer 13.

Figure 3:
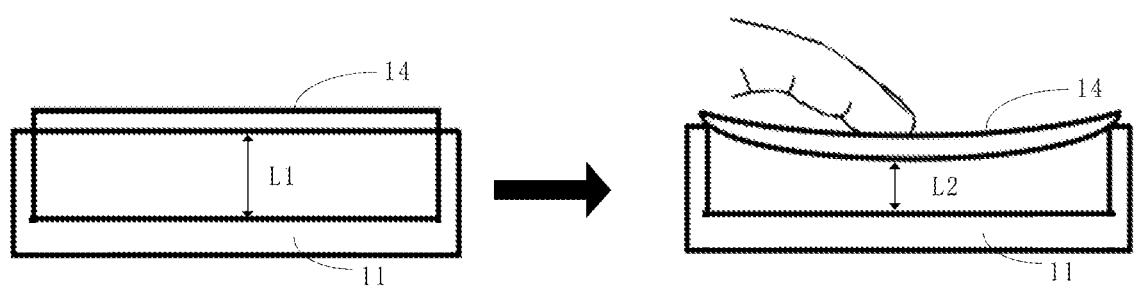
FIG. 3 is a schematic diagram of detecting the pressure on the display panel according to an embodiment of the present invention.

As shown in FIG. 3, when the display panel 1 is not pressed, the distance between the cathode layer 14 and the metal layer 11 is L1. At this time, the control unit 22 may detect that a first capacitance between the cathode layer 14 and the metal layer 11 is $$\frac{\varepsilon \cdot s}{4k\pi \cdot L1},$$

where $\varepsilon$ is the dielectric constant of the medium. The medium refers to all structures between the cathode layer 14 and the metal layer 11, for example, the substrate 12 and the separation layer 13. Specifically, the dielectric constant of the medium is a dielectric constant corresponding to the substrate 12 and the separation layer 13, k is the electrostatic force constant, and S is the overlap area between the cathode layer 14 and the metal layer 11. When the display panel 1 is pressed, the cathode layer 14 is deformed due to the pressure, and the distance between the cathode layer 14 and the metal layer 11 becomes L2. At this time, the control unit 22 detects that a second capacitance between the cathode layer 14 and the metal layer 11 is $$\frac{\varepsilon \cdot s}{4k\pi \cdot L2}.$$

It is to be noted that, in an embodiment, if a larger force is applied to the display panel 1, the cathode layer 14 is deformed more significantly, and the distance between the cathode layer 14 and the metal layer 11 is smaller, so that the second capacitance between the cathode layer 14 and the metal layer 11 is higher. That is, the force applied to the display panel 1 is positively related to the second capacitance.

In conclusion, the control unit 22 may calculate a difference between the second capacitance and the first capacitance to determine the magnitude of the force. That is, the pressure value corresponding to the press may be generated according to the change in capacitance between the cathode layer 14 and the metal layer 11 before and after the press.

Figure 4:
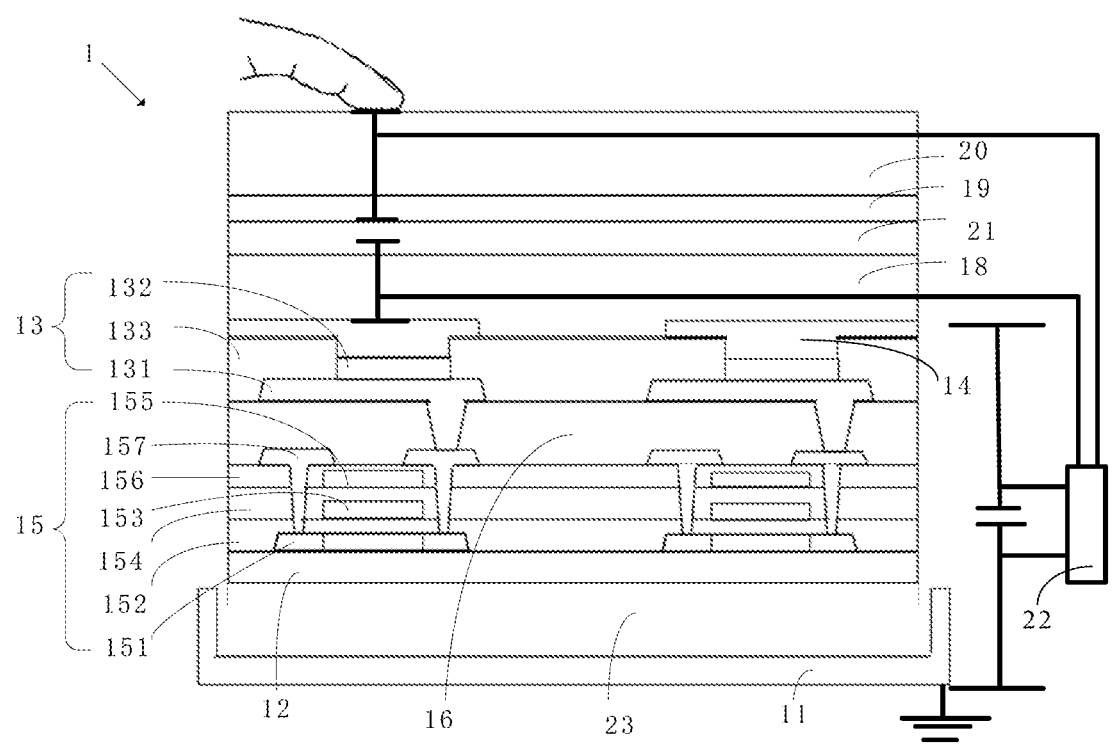
FIG. 4 is still another schematic structure diagram of the display panel according to an embodiment of the present invention.

In some embodiments, as shown in FIG. 4, there is a clearance 23 between the substrate 12 and the metal layer 11. During pressing, the substrate 12 has a space for deformation. In some embodiments, the display panel 1 further includes an elastic layer 17. As shown in FIG. 2, the elastic layer 17 is disposed between the substrate 12 and the metal layer 11.

Figure 5:
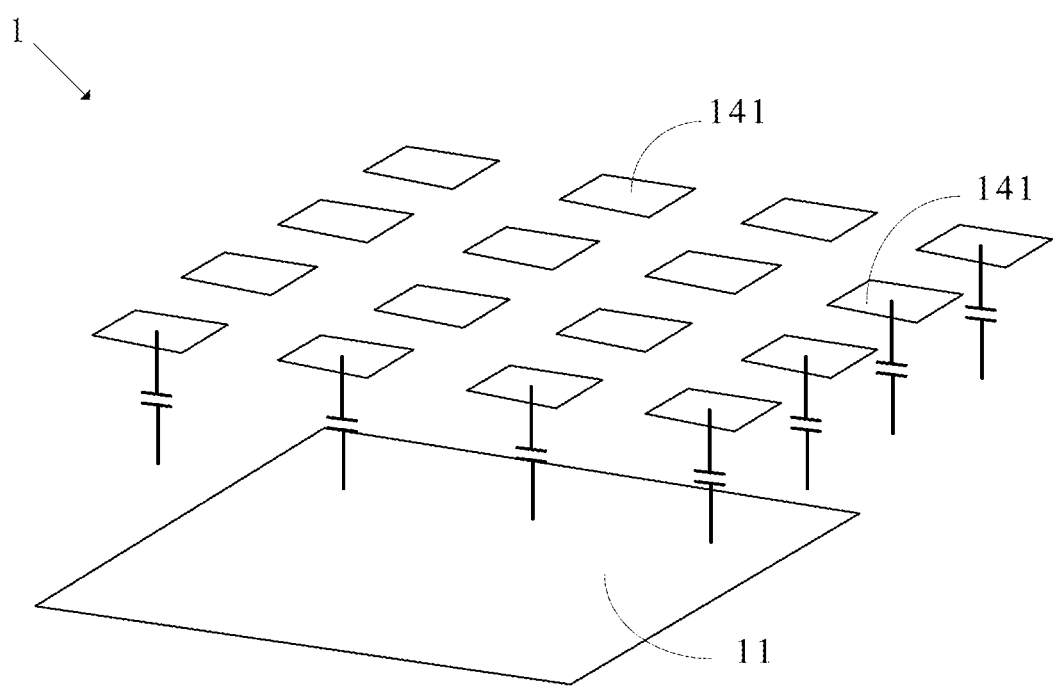
FIG. 5 is a schematic diagram of forming a capacitance between touch units and a metal layer according to an embodiment of the present invention.

In some embodiments, as shown in FIG. 5, the cathode layer 14 includes a plurality of touch units 141 which are electrically connected to the control unit 22. Specifically, the plurality of touch units may be electrically connected to the control unit 22 through a plurality of metal wires. Specifically, the cathode may be patterned to form the plurality of touch units 141 that are electrically independent of each other.

When the display panel 1 operates, the touch units 141 assist the display panel 1 in displaying, and may also assist the display panel 1 in realizing two-dimensional touch. Specifically, when the display panel 1 is pressed by a finger, a capacitance is formed between the finger and a touch unit corresponding to the pressed position. By detecting the change in capacitance between the finger and the corresponding touch unit, the pressed position on the display panel 1 may be calculated.

In some embodiments, the display panel 1 further includes an encapsulation layer 18, a polarizer 19 and a cover plate 20.

The encapsulation layer 18 is disposed on the cathode layer 14. The encapsulation layer 18 is used for preventing corrosion from moisture and oxygen. Specifically, the encapsulation layer may be formed by multiple layers of organic-inorganic films.

The polarizer 19 is disposed on the encapsulation layer 18. The polarizer 19 is used for allowing light emitted from the light-emitting layer 132 to pass therethrough in a particular direction. It is to be noted that, as shown in FIG. 2 or 4, the polarizer 19 is fixed on the encapsulation layer 18 through a glue layer 21.

The cover plate 20 is disposed on the polarizer 19. The cover plate 20 may be a glass cover plate and be characterized by high hardness in order to improve the wear resistance of the display panel 1. When a finger touches the cover plate 20, due to the electric field of the human body, a coupling capacitance is formed between the user and the surface of the cathode layer 14, so that touch detection may be performed.

In the display panel and the display device provided in the embodiments of the present invention, by providing a metal layer capable of forming a capacitance with the cathode layer, the pressure detection is realized by detecting the change in capacitance between the cathode layer and the metal layer, so that the complexity of the pressure detection is reduced.

In conclusion, although the present invention has been described above by preferred embodiments, the preferred embodiments are not intended to limit the present invention. A person of ordinary skill in the art may make various alterations and modifications without departing from the spirit and scope of the present invention. Therefore, the protection scope of the present invention should be subject to the scope defined by the appended claims.

What is claimed is:

1. A display panel, comprising a metal layer, a substrate, a separation layer and a cathode layer; wherein
   the substrate is disposed on the metal layer;
   the separation layer is disposed on the substrate, and both the separation layer and the substrate are used for insulating the metal layer and the cathode layer from each other, wherein the separation layer comprises an anode layer, a light-emitting layer and a pixel definition layer;
   the anode layer is disposed on the substrate;
   the light-emitting layer is disposed on the anode layer; and
   the pixel definition layer is disposed on the anode layer and the light-emitting layer; and
   the cathode layer is disposed on the separation layer, and a capacitance is formed between the cathode layer and the metal layer; and, when the display panel is pressed, the capacitance between the cathode layer and the metal layer changes; wherein
   there is a clearance between the substrate and the metal layer;
   the display panel further comprises an elastic layer which is disposed between the substrate and the metal layer.

2. The display panel according to claim 1, further comprising a control unit which is electrically connected to the metal layer and the cathode layer;
   the control unit is configured to detect a first capacitance between the cathode layer and the metal layer when the display panel is not pressed;
   the control unit is configured to detect a second capacitance between the cathode layer and the metal layer when the display panel is pressed; and
   the control module is configured to generate a force applied to the display panel according to the first capacitance and the second capacitance.

3. A display panel, comprising a metal layer, a substrate, a separation layer and a cathode layer; wherein
   the substrate is disposed on the metal layer;
   the separation layer is disposed on the substrate, and both the separation layer and the substrate are used for insulating the metal layer and the cathode layer from each other, wherein the separation layer comprises an anode layer, a light-emitting layer and a pixel definition layer;
   the anode layer is disposed on the substrate;
   the light-emitting layer is disposed on the anode layer; and
   the pixel definition layer is disposed on the anode layer and the light-emitting layer; and
   the cathode layer is disposed on the separation layer, and a capacitance is formed between the cathode layer and the metal layer; and, when the display panel is pressed, the capacitance between the cathode layer and the metal layer changes.

4. The display panel according to claim 3, further comprising a control unit which is electrically connected to the metal layer and the cathode layer;
   the control unit is configured to detect a first capacitance between the cathode layer and the metal layer when the display panel is not pressed;
   the control unit is configured to detect a second capacitance between the cathode layer and the metal layer when the display panel is pressed; and
   the control module is configured to generate a force applied to the display panel according to the first capacitance and the second capacitance.

5. The display panel according to claim 4, wherein the cathode layer comprises a plurality of touch units which are electrically connected to the control unit;
   the plurality of touch units are electrically independent of each other; and
   the control unit is configured to determine, according to the change in capacitance between the plurality of touch units and a pressing finger, a pressed position on the display panel.

6. The display panel according to claim 3, wherein there is a clearance between the substrate and the metal layer.

7. The display panel according to claim 3, further comprising an elastic layer which is disposed between the substrate and the metal layer.

8. The display panel according to claim 3, wherein the metal layer is grounded.

9. The display panel according to claim 3, further comprising a thin film transistor layer and a planarization layer;
   the thin film transistor layer is disposed on the substrate;
   the planarization layer is disposed on the thin film transistor layer; and
   the separation layer is disposed on the planarization layer.

10. The display panel according to claim 3, further comprising an encapsulation layer, a polarizer and a cover plate;
    the encapsulation layer is disposed on the cathode layer;
    the polarizer is disposed on the encapsulation layer; and
    the cover plate is disposed on the polarizer.

11. A display device, comprising a display panel, wherein the display panel includes:

a metal layer, a substrate, a separation layer and a cathode layer; wherein the substrate is disposed on the metal layer;

the separation layer is disposed on the substrate, and both the separation layer and the substrate are used for insulating the metal layer and the cathode layer from each other wherein the separation layer comprises an anode layer, a light-emitting layer and a pixel definition layer;

the anode layer is disposed on the substrate;

the light-emitting layer is disposed on the anode layer; and the pixel definition layer is disposed on the anode layer and the light-emitting layer; and the cathode layer is disposed on the separation layer, and a capacitance is formed between the cathode layer and the metal layer; and, when the display panel is pressed, the capacitance between the cathode layer and the metal layer changes.

12. The display device according to claim 11, wherein the display panel further includes a control unit which is electrically connected to the metal layer and the cathode layer;

the control unit is configured to detect a first capacitance between the cathode layer and the metal layer when the display panel is not pressed;

the control unit is configured to detect a second capacitance between the cathode layer and the metal layer when the display panel is pressed; and the control module is configured to generate a force applied to the display panel according to the first capacitance and the second capacitance.

13. The display device according to claim 12, wherein the cathode layer comprises a plurality of touch units which are electrically connected to the control unit;

the plurality of touch units are electrically independent of each other; and the control unit is configured to determine, according to the change in capacitance between the plurality of touch units and a pressing finger, a pressed position on the display panel.

14. The display device according to claim 11, wherein there is a clearance between the substrate and the metal layer.

15. The display device according to claim 11, wherein the display panel further includes an elastic layer which is disposed between the substrate and the metal layer.

16. The display device according to claim 11, wherein the metal layer is grounded.

17. The display device according to claim 11, wherein the display panel further includes a thin film transistor layer and a planarization layer;

the thin film transistor layer is disposed on the substrate;

the planarization layer is disposed on the thin film transistor layer; and the separation layer is disposed on the planarization layer.

18. The display device according to claim 11, wherein the display panel further includes an encapsulation layer, a polarizer and a cover plate;

the encapsulation layer is disposed on the cathode layer;

the polarizer is disposed on the encapsulation layer; and the cover plate is disposed on the polarizer.

* * * * *

UNITED STATES PATENT AND TRADEMARK OFFICE
CERTIFICATE OF CORRECTION

PATENT NO. : 10,782,837 B2  
APPLICATION NO. : 16/311006  
DATED : September 22, 2020  
INVENTOR(S) : Jian Ye Page 1 of 1

It is certified that error appears in the above-identified patent and that said Letters Patent is hereby corrected as shown below:

On the Title Page

Add Item:
--(30) Foreign Application Priority Data
09/25/2018 (CN) 201811115622.3--

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*